(12) United States Patent
Castex et al.

(10) Patent No.: US 11,626,319 B2
(45) Date of Patent: *Apr. 11, 2023

(54) SEMICONDUCTOR-ON-INSULATOR SUBSTRATE FOR RF APPLICATIONS

(71) Applicant: Soitec, Bernin (FR)

(72) Inventors: Arnaud Castex, Grenoble (FR); Oleg Kononchuk, Theys (FR)

(73) Assignee: Soitec, Bernin (FR)

( * ) Notice: Subject to any disclaimer, the term of this patent is extended or adjusted under 35 U.S.C. 154(b) by 56 days.

This patent is subject to a terminal disclaimer.

(21) Appl. No.: 17/090,608

(22) Filed: Nov. 5, 2020

(65) Prior Publication Data
US 2021/0057269 A1 Feb. 25, 2021

Related U.S. Application Data

(63) Continuation of application No. 16/090,349, filed as application No. PCT/EP2017/057614 on Mar. 30, 2017, now Pat. No. 10,886,162.

(30) Foreign Application Priority Data

Mar. 31, 2016 (FR) ...................................... 1652782

(51) Int. Cl.
*H01L 21/322* (2006.01)
*H01L 27/12* (2006.01)
(Continued)

(52) U.S. Cl.
CPC .... *H01L 21/76254* (2013.01); *H01L 21/0245* (2013.01); *H01L 21/02381* (2013.01);
(Continued)

(58) Field of Classification Search
None
See application file for complete search history.

(56) References Cited

U.S. PATENT DOCUMENTS 6,897,084 B2  5/2005 Binns et al.
8,536,035 B2  9/2013 Botula et al.
(Continued)

FOREIGN PATENT DOCUMENTS

CN  103247566 B  4/2016
JP  2001-168308 A  6/2001
(Continued)

OTHER PUBLICATIONS

Taiwan Office Action for TW Application No. 106109658 dated Jul. 7, 2020, 14 pages.
(Continued)

*Primary Examiner* — Daniel Whalen
(74) *Attorney, Agent, or Firm* — TraskBritt

(57) ABSTRACT

A semiconductor-on-insulator substrate for use in RF applications, such as a silicon-on-insulator substrate, comprises a semiconductor top layer, a buried oxide layer and a passivation layer over a support substrate. In addition, a penetration layer is provided between the passivation layer and the silicon support substrate to ensure sufficient high resistivity below RF features and avoid increased migration of dislocations in the support substrate. RF devices may be fabricated on and/or in such a semiconductor-on-insulator substrate.

17 Claims, 4 Drawing Sheets

(51) Int. Cl.
*H01L 21/762* (2006.01)
*H01L 21/02* (2006.01)

(52) U.S. Cl.
CPC .. *H01L 21/02488* (2013.01); *H01L 21/02505* (2013.01); *H01L 21/02532* (2013.01); *H01L 21/76251* (2013.01); *H01L 27/1203* (2013.01)

(56) References Cited

U.S. PATENT DOCUMENTS

| | | | |
|---|---|---|---|
| 10,886,162 B2* | 1/2021 | Castex | H01L 21/02505 |
| 2008/0170821 A1* | 7/2008 | Kissa | G02F 1/0316 |
| | | | 385/14 |
| 2009/0110898 A1 | 4/2009 | Levy et al. | |
| 2012/0235283 A1 | 9/2012 | Libbert et al. | |
| 2013/0196493 A1* | 8/2013 | Botula | H01L 21/76254 |
| | | | 257/E21.334 |
| 2014/0084290 A1 | 3/2014 | Allibert et al. | |

FOREIGN PATENT DOCUMENTS

| | | |
|---|---|---|
| JP | 2013-513234 A | 4/2013 |
| JP | 2014-509087 A | 4/2014 |
| JP | 2014-512091 A | 5/2014 |
| JP | 2017-504210 A | 2/2017 |
| WO | 2015/112308 A1 | 7/2015 |

OTHER PUBLICATIONS

International Search Report for International Application No. PCT/EP2017/057614 dated Jun. 12, 2017, 3 pages.
International Written Opinion for International Application No. PCT/EP2017/057614 dated Jun. 12, 2017, 6 pages.
Japanese Notice of Reasons for Refusal for Japanese Application No. 2018-550442 dated Sep. 19, 2019, 2 pages.
Korean Office Action for Korean Application No. 10-2018-7030528 dated Feb. 15, 2020, 5 pages.
Chinese First Office Action for Application No. 201880007067.4 dated Sep. 16, 2022, 9 pages.

* cited by examiner

SEMICONDUCTOR-ON-INSULATOR SUBSTRATE FOR RF APPLICATIONS

CROSS-REFERENCE TO RELATED APPLICATIONS

This application is a continuation of U.S. patent application Ser. No. 16/090,349, filed Oct. 1, 2018, now U.S. Pat. No. 10,886,162, issued Jan. 5, 2021, which is a national phase entry under 35 U.S.C. § 371 of International Patent Application PCT/EP2017/057614, filed Mar. 30, 2017, designating the United States of America and published in English as International Patent Publication WO 2017/167923 A1 on Oct. 5, 2017, which claims the benefit under Article 8 of the Patent Cooperation Treaty to French Patent Application Serial No. 1652782, filed Mar. 31, 2016, the disclosure of each of which is hereby incorporated herein in its entirety by this reference.

TECHNICAL FIELD

The application relates to a semiconductor-on-insulator substrate for use in radio frequency ("RF") applications, in particular, a silicon-on-insulator substrate, comprising a semiconductor top layer, a buried oxide layer and a passivation layer over a silicon support substrate and a corresponding method. The disclosure also relates to an RF device.

BACKGROUND

Known substrates for radio frequency (RF) applications comprise a trilayer structure of silicon (Si) on silicon dioxide ($SiO_2$) in turn on a polycrystalline Si layer. This trilayer structure is provided on a bulk high resistivity support substrate with a low interstitial oxygen content ("low Oi"). For such a substrate, the interstitial oxygen content is in a range between 5 ppma to 10 ppma instead of 20 ppma to 25 ppma for standard Oi, or 25 ppma to 30 ppma for high Oi substrates. High resistivity in this context typically relates to resistivity values of 3000 Ωm or more. This high bulk resistivity is needed in RF devices so as to limit or suppress parasitic signals coming from all material below the active device, also called the substrate losses.

The polycrystalline Si layer is needed to suppress further parasitic losses that can occur due to surface charges, which exist at the interface between the support substrate and the silicon dioxide layer under the influence of an electrical field. This polycrystalline Si layer acts as a passivation layer and can, therefore, reduce signal losses.

Interstitial oxygen is known to give thermal donors following thermal treatments and, therefore, decreases the bulk resistivity of the support substrate, thereby increasing substrate losses. Thus, there is a need for a low Oi substrate. The use of low Oi is, however, not without drawbacks.

A low Oi content makes silicon more sensitive to dislocation migration. Oxygen interstitial atoms tend to attach to silicon atoms and aggregate into small precipitates of $SiO_2$ that prevent migration of dislocations into the crystal lattices. With low Oi content, there are less $SiO_2$ precipitates present in the material leading to increased dislocation migration upon thermal treatment during manufacturing of the semiconductor-on-insulator substrate and/or the RF devices leading to an unwanted modification of the crystal structure and the appearance of so called slip lines. The migration of dislocations can also lead to plastic deformation of the substrate, which can lead to overlay problems during lithography in CMOS processing.

BRIEF SUMMARY

It is, therefore, an object of the present disclosure to provide an improved semiconductor-on-insulator substrate suitable for RF applications that overcomes or at least reduces the problems previously identified.

This object is achieved with a semiconductor-on-insulator substrate according to the disclosure, in particular, a silicon-on-insulator substrate, comprising a semiconductor top layer, a buried oxide layer and a passivation layer over a silicon support substrate, wherein a penetration layer is provided between the passivation layer and the silicon support substrate, and wherein the penetration layer is a higher resistive silicon layer with lower interstitial oxygen content than the silicon support substrate.

The disclosure is not limited to a semiconductor top layer but can be applied to other types of materials of the top layer, such as, for instance, piezoelectric materials, in particular, Lithium Tantalate or Lithium Niobate.

According to the disclosure, a specific layer, the penetration layer with a low Oi content, is introduced so that a support substrate can be used in which the slip line and overlay problem can be reduced by lowering the ability of dislocations to migrate within the support substrate. Indeed, the low Oi content is just needed to a certain depth, starting from the silicon layer, depending on how far an RF signal of an RF device that will be prepared on the substrate will penetrate into the semiconductor-on-insulator substrate.

According to an embodiment, the passivation layer and the penetration layer can be of the same material. In this case, negative impacts of lattice mismatch at the interface can be reduced or even eliminated.

According to an embodiment, the passivation layer can be a polycrystalline layer and the penetration layer can be a monocrystalline material. The polycrystalline layer acts as a trap for charges and allows a reduction of parasitic losses, whereas the monocrystalline layer has the advantage that layers with low surface roughness can be obtained independently of the thickness of the layer.

According to a variant, the penetration layer can be a polycrystalline layer. In this case, the polycrystalline layer is provided with a sufficient thickness to fulfill both roles, the reduction of surface-related parasitic losses and the substrate losses.

According to an embodiment of the disclosure, low interstitial oxygen content can relate to a concentration of less than 15 ppma, in particular, 5 ppma to 10 ppma. In this concentration range, the desired resistivity level can be reached in the passivation layer to reduce the substrate losses. Further, the term "high resistive" can relate to a resistivity of 2000 Ωm or more, in particular, 3000 Ωm or more, and this even after thermal treatments of duration of at least 1 hour at temperatures higher than 450° C. It shall be understood that other impurities that normally influence the electrical behavior of silicon, also known as donors and acceptors, have a concentration less than $1\times10^{12}$ $cm^{-3}$, to obtain the relationship between interstitial oxygen content and the resistivity level.

According to an embodiment, the passivation layer and the penetration layer have a combined thickness of about 3 µm to 30 µm, in particular, 4 µm to 10 µm, even more in particular, about 5 µm. Compared to the prior art semiconductor-on-insulator substrates with low Oi silicon support substrates having a typical thickness of 725 µm, only a thin part of the semiconductor-on-insulator substrate will be subject to migration of dislocations in low Oi regions. Thus, the lithography steps of subsequent device manufacturing can be simplified.

The object of the disclosure is also achieved with a Radio Frequency (RF) device. The inventive RF device comprises electrically isolated device structures, in particular, conductive lines within a device might be electrically isolated to each other, having a minimal distance d between each other provided on and/or in a semiconductor-on-insulator substrate as described above, and wherein the thickness of the buried oxide layer, the passivation layer, and the penetration layer together is such that RF signals at most penetrate into the penetration layer. Thus, by adjusting the thickness of the penetration layer to the particular dimension d of the RF design, substrate losses can be reduced while manufacturability, in particular, with respect to overlay during lithography, can be kept high.

According to an embodiment of the disclosure, the thickness of the buried oxide layer, the passivation layer, and the penetration layer together can be such that it does not exceed ten times, in particular, 5 times, the distance d.

The object of the disclosure is also achieved with the method for fabricating a semiconductor-on-insulator substrate as described above, wherein the penetration layer is epitaxially grown on the support substrate and the semiconductor top layer and the buried oxide layer are transferred onto the passivation layer by a layer transfer process, in particular, comprising a bonding method. Preferably, both the passivation layer and the penetration layer are epitaxially grown.

The object is further achieved with an alternative method for fabricating a semiconductor-on-insulator substrate as described above, wherein the penetration layer is transferred onto the support substrate by layer transfer method, in particular, a bonding method. This could, for instance, be achieved by bonding the support substrate and low Oi substrate and then etching back the Oi substrate to the desired thickness, or by applying a SMART CUT® type process comprising the steps of forming a predetermined splitting area inside the Oi substrate, bonding the Oi substrate to the support substrate, and detaching the remainder of the Oi substrate, e.g., by a thermal treatment, to obtain the penetration layer on the support substrate.

With the above-mentioned methods, the advantageous substrates can be obtained.

The object of the disclosure is also achieved with a method for fabricating a Radio Frequency device as described above and comprising the steps of: providing a plurality of semiconductor-on-insulator substrates with different thicknesses of the penetration layer, forming radio frequency devices on or in the semiconductor-on-insulator substrates, determining the penetration depth of RF signals in the plurality of semiconductor-on-insulator substrates, choosing the semiconductor-on-insulator substrate with the thickness of the penetration layer for which the RF signal penetrates at most into the penetration layer. In this way, an optimized penetration layer thickness can be determined so that manufacturability is optimized while maintaining functionality of the RF devices.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

The above and other objects and features of the present disclosure will become more apparent from the following description and preferred embodiments given in conjunction with the accompanying drawings in which.

DETAILED DESCRIPTION

Figure 1:
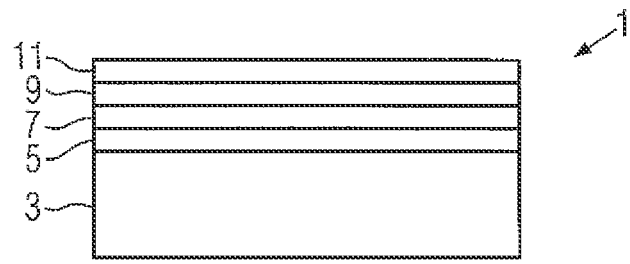
FIG. 1 illustrates a first embodiment of the semiconductor-on-insulator substrate according to the disclosure.

FIG. 1 schematically illustrates a semiconductor-on-insulator substrate (SoI substrate) 1 according to a first embodiment of the disclosure. The SoI substrate 1 according to this embodiment is for use as a starting material of the manufacture of radio frequency (RF) devices, e.g., used in communication devices, like mobile phones, smartphones, tablets or personal computers.

As already stated above, the disclosure is not limited to a semiconductor top layer but can be applied to other types of materials of the top layer, such as, for instance, piezoelectric materials, in particular, Lithium Tantalate or Lithium Niobate. Such a generalization holds for all embodiments as described in the following with respect to a semiconductor top layer that may, in a general way, be a top layer comprising semiconductor material or a piezoelectric material. Thus, an SoI type substrate comprising a piezoelectric top layer would also be in the scope of the disclosure.

The SoI substrate 1 comprises a silicon support substrate 3, a penetration layer 5, a passivation layer 7, a buried oxide layer 9 and a semiconductor top layer 11.

The silicon support substrate 3 is a standard silicon (Si) substrate or Si wafer, with a standard resistivity of 15 $\Omega$m, an interstitial oxygen content of about 20 ppma to 25 ppma, and a thickness on the order of 700 µm to 750 µm. The buried oxide layer 9, also referred to as a "box" layer, in this embodiment is a silicon dioxide ($SiO_2$) layer with a typical thickness of 100 nm to 1000 nm. The semiconductor top layer 11 in this embodiment is a silicon layer with a thickness of about 50 nm to 200 nm.

Sandwiched between the Si support substrate 3 and the buried oxide layer 9 are the penetration layer 5 and the passivation layer 7.

In this embodiment, the penetration layer 5 is a silicon layer with a high resistivity layer, with a resistivity value of 2000 $\Omega$m or more, in particular, a layer of 3000 $\Omega$m or more, and a low interstitial oxygen content relating to a concentration of interstitial oxygen of less than 15 ppma, in particular, 5 ppma to 10 ppma. As already mentioned above, such a resistivity value is maintained even after a thermal treatment of at least 1 hour at a temperature higher than 450° C. According to the disclosure, the penetration layer 5 thus has a higher resistivity and lower interstitial oxygen content than the silicon support substrate 3. The penetration layer 5 in this embodiment is a monocrystalline layer.

The passivation layer 7 in this embodiment is a polycrystalline Si layer with a typical thickness of about 200 nm to 2500 nm.

The SoI substrate 1 is of particular interest for RF applications. One problem associated with RF devices is the occurrence of signal losses. The passivation layer 7 and the penetration layer 5 are introduced in the SoI substrate structure to reduce such signal losses. Parasitic losses occur when a signal passes through a signal line of an RF device present in or on the Si layer. Parasitic signals pass via the buried oxide layer into the Si substrate and can reach other signal lines of the RF device. The corresponding losses are called substrate losses.

To reduce the losses, the penetration layer 5 is a high resistance layer of low Oi content, thus with a much higher resistance than a standard normal Oi Si substrate. Due to the high resistance, the losses can be reduced.

Further, losses that might occur due to surface charges accumulating at the surface of the penetration layer 5 are reduced by the presence of the polycrystalline passivation layer 7, hindering the contribution of such surface charges to electrical conduction and thus reducing surface charge-related signal losses.

By combining a low Oi penetration layer 5 together with a standard Si support substrate 3 with normal Oi concentration instead of using only a low Oi Si substrate as in the prior art, it becomes possible to reduce the occurrence of unwanted slip lines and dislocation migration that have a negative impact on the production yield.

The thickness of buried oxide layer 9, the passivation layer 7 and the penetration layer 5 are thereby chosen such that the parasitic signals arising from the signal running through an RF design reach at most into the penetration layer 5 and thus do not "see" the lower resistance in the standard Si support substrate 3. As a consequence, the layers together have a combined thickness of at least 3 µm and at most 30 µm, in particular, at most 10 µm, and more particularly, at most 5 µm.

At the same time, a standard Si support substrate 3 can be used that allows RF device manufacturers to use standard CMOS fabrication methods.

Figure 2:
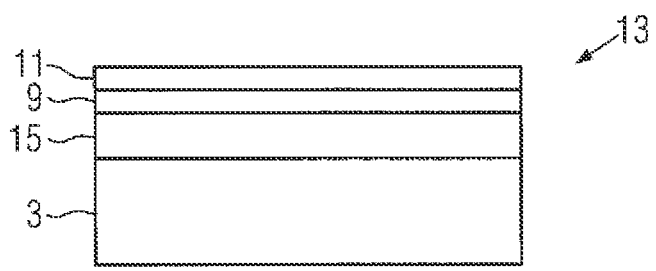
FIG. 2 illustrates a second embodiment of the semiconductor-on-insulator substrate according to the disclosure.

FIG. 2 schematically illustrates a semiconductor-on-insulator substrate (SoI substrate) 13 according to a second embodiment of the disclosure. Features of the second embodiment that are the same as in the first embodiment carry the same reference numerals as they are referred to in their description above.

The difference between the second and the first embodiment is that, in the SoI substrate 13 of the second embodiment, the passivation layer and the penetration layer are made of the same material, namely silicon, and are of the same crystalline structure, namely polycrystalline. Thus, they are forming one modified passivation layer 15 with a thickness that goes far beyond the thickness of passivation layers in the prior art.

Figure 3:
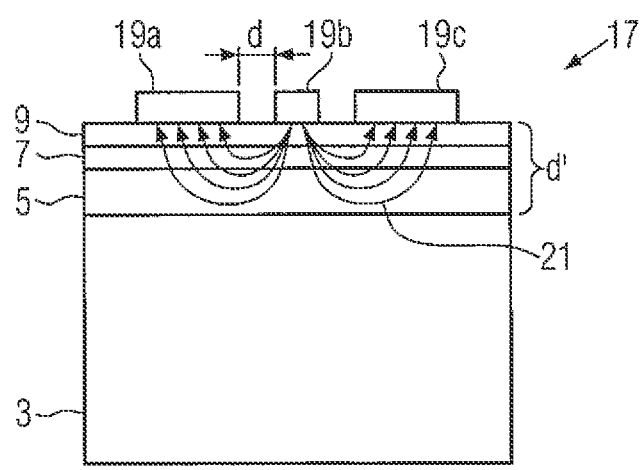
FIG. 3 illustrates a third embodiment of the disclosure, namely an RF device on a semiconductor-on-insulator substrate according to the disclosure.

FIG. 3 schematically illustrates a radio frequency (RF) device 17 according to a third embodiment of the disclosure. The RF device 17 is arranged on or in the SoI substrate 1, in particular, in the Si layer 11 as illustrated in FIG. 1. Features of the third embodiment that are the same as in the first and second embodiments carry the same reference numerals as they are referred to in their description above. As an alternative, the SoI substrate 13 as illustrated in FIG. 2 could be used.

The RF device 17 comprises a plurality of electrically isolated device structures 19a, 19b, 19c with a minimal distance d between two structures, here 19a, 19b. When an RF signal passes through device structure 19b, parasitic signals 21 pass through the SoI substrate. According to the disclosure, their impact is reduced by the penetration layer 5 and the passivation layer 7 as explained in detail above with respect to the first and second embodiments.

According to this embodiment of the disclosure, the thickness d' is chosen such that it does not exceed ten times, in particular, five times, the distance d of the RF device 17. In this case, the RF parasitic signals 21 can only reach the penetration layer 5 with its higher resistivity and do not pass via the better conducting Si support substrate 3.

Figure 4:
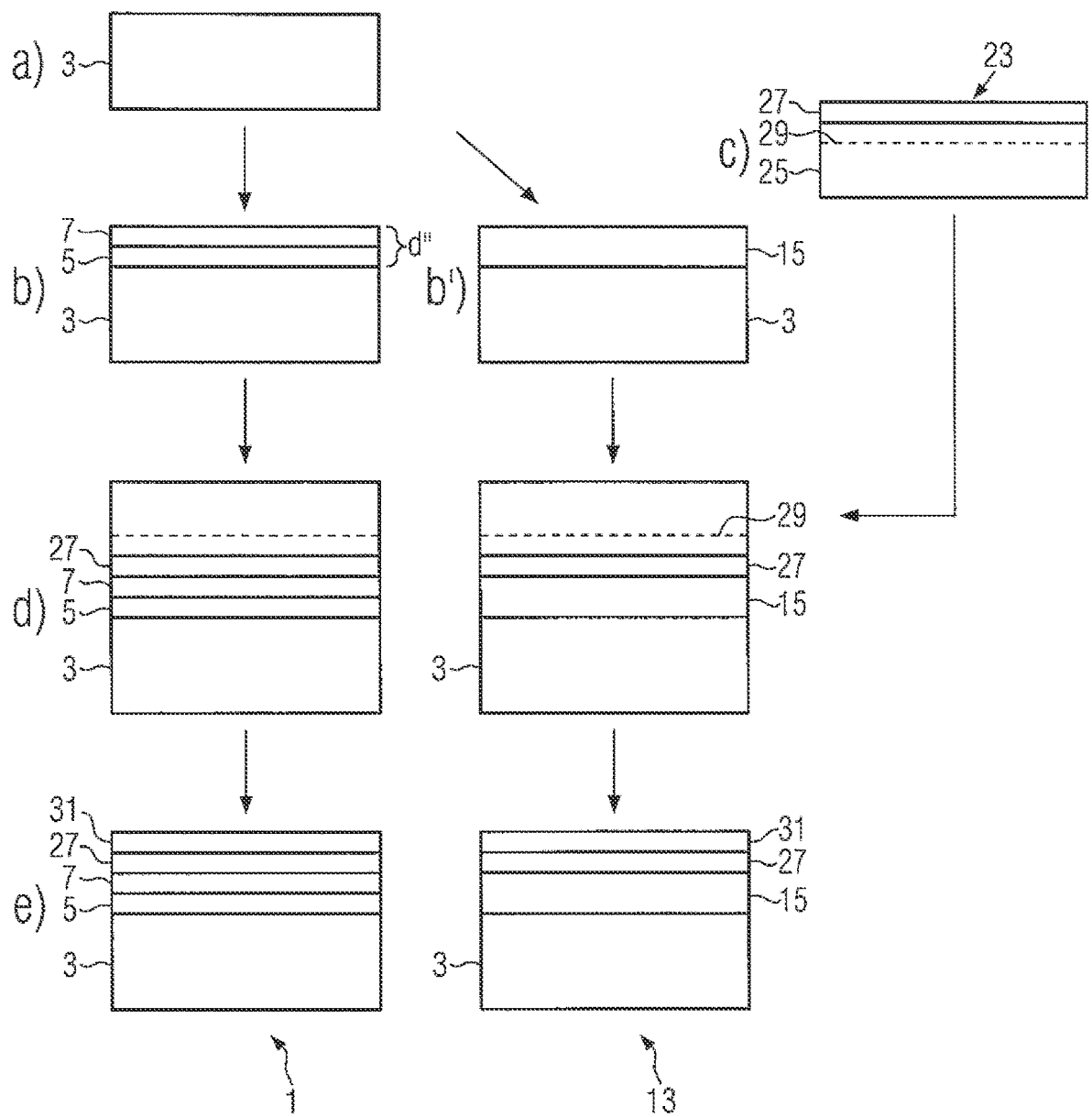
FIG. 4 illustrates a fourth embodiment of the disclosure, namely a method to fabricate a semiconductor-on-insulator substrate according to the disclosure.

FIG. 4 illustrates a fourth embodiment of the disclosure, namely, a first method to fabricate a semiconductor-on-insulator substrate according to the first or second embodiment of the disclosure. Again, features of the fourth embodiment that are the same as in the first to third embodiments carry the same reference numerals as they are referred to in their description above.

Step a) consists of providing a standard Si support substrate 3 with normal interstitial oxygen content (Oi) of about 20 ppma to 25 ppma. This type of substrate is commonly used in the semiconductor industry.

During step b), first, a monocrystalline Si layer, which constitutes the penetration layer 5, is homoepitaxially grown on the Si support substrate 3. The growth conditions are chosen such that a lower Oi content of 5 ppma to 10 ppma oxygen concentration is achieved therein. Thus, a higher resistivity of at least 2000 $\Omega$m or more, in particular, 3000 $\Omega$m, can be obtained compared to the Si support substrate 3 that is obtained in the epitaxial layer.

Subsequent to the epitaxial growth, the growth conditions are changed to then obtain a polycrystalline layer corresponding to the passivation layer 7.

The thickness d" of the two layers 5 and 7 is determined according to the parameters described above with respect to the embodiments 1 to 3 to achieve the thickness d' of the layers 5, 7 and 9.

According to an alternative, step b) could be replaced by step b') during which the modified passivation layer 15, fulfilling the role of both the penetration layer 5 and the passivation layer 7 at the same time, is grown as a polycrystalline layer directly onto the Si support substrate 3.

Step c) consists of preparing a donor substrate 23 comprising a Si donor substrate 25 with a silicon dioxide layer 27 and a predetermined splitting area 29 in the Si donor substrate 25, which is formed by ion implantation as known in the art.

During step d), the donor substrate 23 is attached, e.g., by bonding, via the surface of the silicon dioxide layer 27 to the surface of the passivation layer 7 in the first alternative or to the modified passivation layer 15 in the second alternative.

During step e), a detachment treatment, e.g., a thermal treatment, is carried out to achieve a detachment at the predetermined splitting area 29 to thereby transfer a Si layer 31 of the Si donor substrate 23 and the silicon dioxide layer 27 onto the passivation layer 7 in the first alternative or to the modified passivation layer 15 in the second alternative. Silicon dioxide layer 27 thus corresponds to the buried oxide layer 9 and Si layer 31 to the semiconductor top layer of the first and second embodiment.

Using this method, the SoI substrate 1 according to the first embodiment or the SoI substrate 13 according to the second embodiment can be obtained. This substrate can then be used for the fabrication of RF devices, e.g., using CMOS process steps.

Figure 5:
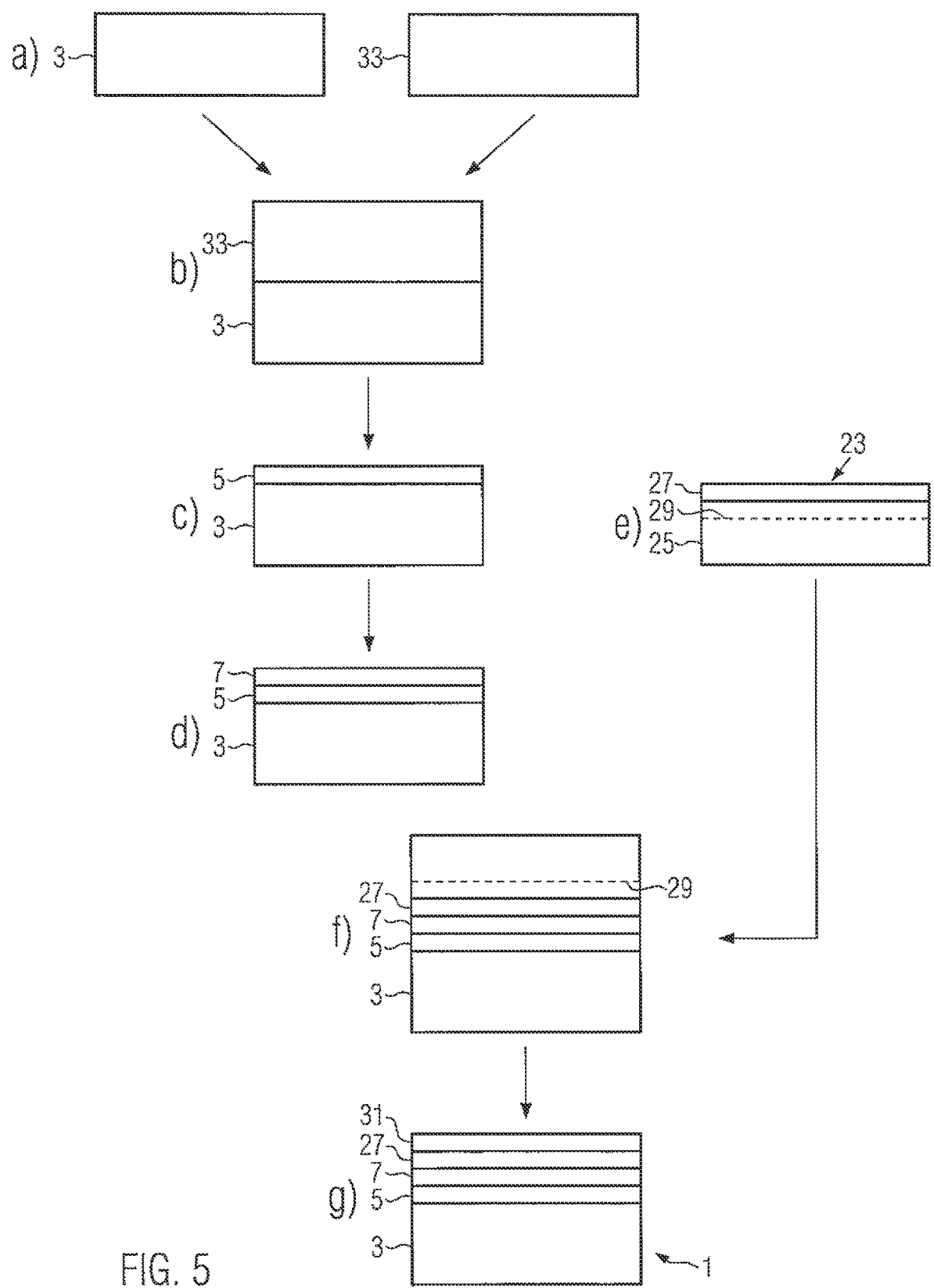
FIG. 5 illustrates a fifth embodiment of the disclosure, namely, an alternative method to fabricate a semiconductor-on-insulator substrate according to the disclosure.

FIG. 5 illustrates a fifth embodiment of the disclosure, namely, an alternative method to fabricate a semiconductor-on-insulator substrate according to the disclosure. The method illustrated in FIG. 5 is suitable to fabricate a SoI substrate 1 according to the first embodiment. Features of the fifth embodiment that are the same as in the first embodiment and the method according to the fourth embodiment carry the same reference numerals as they are referred to in their description above.

Step a) consists of providing a standard Si support substrate 3, e.g., a Si wafer, thus with normal interstitial oxygen content and normal resistivity and in providing a low interstitial oxygen content Si substrate 33, e.g., a low Oi Si wafer, having an Oi content of 5 ppma to 10 ppma and a resistivity of more than 2000 Ωm, in particular, more than 3000 Ωm.

Step b) consists of attaching, e.g., by bonding, the Si support substrate 3 to the low Oi Si substrate 33.

During step c), the low Oi Si substrate 33 is etched back to obtain a penetration layer 5 of the desired thickness as described above.

Step d) then consists of growing the polycrystalline Si passivation layer 7 over the penetration layer 5, typically with a thickness of 200 nm to 2500 nm.

According to an alternative, if the low interstitial oxygen content Si substrate 33 is of polycrystalline nature, the etch back of step c) can be used to obtain a modified passivation layer fulfilling the role of the passivation layer 7 and the penetration layer 5 at the same time. In this alternative, step d) is then not performed.

Step e) consists of preparing a donor substrate 23 comprising a Si donor substrate 25 with a silicon dioxide layer 27 and a predetermined splitting area 29 in the Si donor substrate 25, e.g., formed by ion implantation as known in the art.

During step f), the donor substrate 23 is attached, e.g., by bonding, via the surface of the silicon dioxide layer 27 to the surface of the passivation layer 7.

During step g), a detachment treatment, e.g., a thermal treatment, is carried out to obtain a detachment at the predetermined splitting area 29 to thereby transfer a Si layer 31 of the Si donor substrate 23 and the silicon dioxide layer 27 onto the passivation layer 7. Silicon dioxide layer 27 thus corresponds to the buried oxide layer 9 and Si layer 31 to the semiconductor top layer 11 of the first. A SoI substrate 1 according to the first embodiment is thus obtained.

Figure 6:
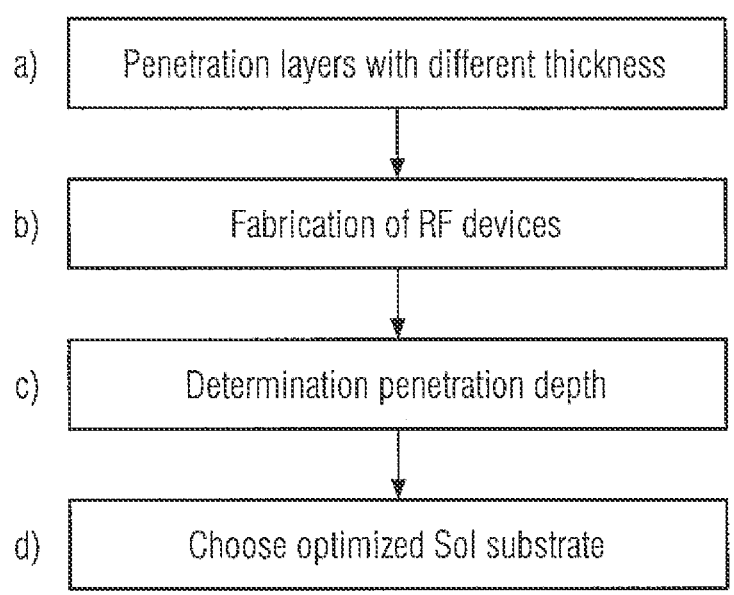
FIG. 6 illustrates a sixth embodiment of the disclosure, namely, a method to choose the thickness of the penetration layer of a semiconductor-on-insulator substrate according to the disclosure.

FIG. 6 illustrates a sixth embodiment of the disclosure, namely, a method to choose the thickness of the penetration layer of a semiconductor-on-insulator substrate according to the disclosure. The choice depends on the RF devices to be fabricated on or in the SoI substrate 1, 13 according to the disclosure. The reference numerals used in the following relate to the features as already described above and carrying the same reference numerals.

The first step a) consists of providing a plurality of semiconductor-on-insulator substrates 1 with different thicknesses of the penetration layer 5. The thicknesses are chosen such that the overall thickness of the buried oxide layer 9, the passivation layer 7, and the penetration layer 5 together remains in a range extending from about 3 μm to about 30 μm. The same applies to the SoI substrate 13 according to the second embodiment and the modified passivation layer 15.

In the next step b), radio frequency devices, like RF device 17, are formed on or in the semiconductor-on-insulator substrates 1, 13. For each one of the different SoI substrates with different penetration layer 5 thicknesses, the same RF devices 17 using the same fabrication process will be manufactured.

Subsequently during step c), the penetration depth of parasitic RF signals is determined by determining the parasitic signal in neighboring RF device structures, e.g., 19a or 19c in case the reference single passes via structure 19b. Alternatively, the attenuation of the parasitic signal can also be determined.

Finally, according to step d), the semiconductor-on-insulator substrate 1 or 13 with the thickness of the penetration layer 5 (or the modified passivation layer 15) for which the parasitic RF signal penetrates at most into the penetration layer 5 (or the modified passivation layer 15) is chosen. Amongst the SoI substrates 1 or 13 satisfying the condition, the one with the thinnest penetration layer 5 (or the thinnest modified passivation layer 15) is the one with optimized thickness parameters.

Following this feedback loop, mass production of SoI substrates 1 or 13 with optimized thickness of the penetration layer 5 or modified passivation layer 15 can then be started.

In the above embodiments, the semiconductor layer 11 was made of silicon and the buried oxide layer of $SiO_2$. According to further variants, other suitable materials, like SiGe or GaAs, can also be used. Instead of polycrystalline Si, other charge trapping layers could also be used for the passivation layer 7.

What is claimed is:

1. A substrate, comprising:
   a silicon support substrate;
   a monocrystalline penetration layer over the silicon support substrate;
   a polycrystalline passivation layer over the penetration layer;
   a buried oxide layer over the passivation layer; and
   a top layer;
   wherein the penetration layer exhibits an electrical resistivity higher than the silicon support substrate, and wherein the penetration layer has a lower interstitial oxygen content than the silicon support substrate.

2. The substrate of claim 1, wherein the top layer comprises silicon.

3. The substrate of claim 1, wherein the top layer comprises a piezoelectric material.

4. The substrate of claim 3, wherein the piezoelectric material comprises at least one material selected from among lithium tantalate and lithium niobate.

5. The substrate of claim 1, wherein the passivation layer and the penetration layer comprise the same material.

6. The substrate of claim 5, wherein the same material comprises silicon.

7. The substrate of claim 1, wherein the penetration layer comprises a polycrystalline layer.

8. The substrate of claim 1, wherein the penetration layer has an interstitial oxygen content of less than 15 ppma.

9. The substrate of claim 8, wherein the interstitial oxygen content of the penetration layer is in a range extending from 5 ppma to 10 ppma.

10. The substrate of claim 1, wherein the penetration layer has a resistivity of 2000 Ωm or more.

11. The substrate of claim 10, wherein the resistivity of the penetration layer is 3000 Ωm or more.

12. The substrate of claim 1, wherein the buried oxide layer, the passivation layer, and the penetration layer have a combined thickness of from 3 µm to 30 µm.

13. The substrate of claim 12, wherein the combined thickness of the buried oxide layer, the passivation layer, and the penetration layer is in a range extending from 4 µm to 10 µm.

14. The substrate of claim 13, wherein the combined thickness of the buried oxide layer, the passivation layer, and the penetration layer is about 5 µm.

15. A radio frequency (RF) device, comprising:
the substrate of claim 1; and
electrically isolated device structures having an average distance between one other provided on and/or in the substrate, wherein a combined thickness of the passivation layer and the penetration layer is such that RF signals penetrate at most into the penetration layer.

16. The radio frequency device of claim 15, wherein a combined thickness of the buried oxide layer, the passivation layer, and the penetration layer does not exceed ten times the average distance between the electrically isolated device structures.

17. The radio frequency device of claim 16, wherein the combined thickness of the buried oxide layer, the passivation layer, and the penetration layer does not exceed five times the average distance between the electrically isolated device structures.

* * * * *